United States Patent [19]

Yew et al.

[11] Patent Number: 5,801,094
[45] Date of Patent: Sep. 1, 1998

[54] DUAL DAMASCENE PROCESS

[75] Inventors: Tri-Rung Yew, Hsin-Chu; Meng-Chang Liu, Chia-Yi; Water Lur; Shih-Wei Sun, both of Taipei, all of Taiwan

[73] Assignee: United Microelectronics Corporation, Hsin-Chu City, Taiwan

[21] Appl. No.: 873,500

[22] Filed: Jun. 12, 1997

Related U.S. Application Data

[60] Provisional application No. 60/038,872, Feb. 28, 1997.
[51] Int. Cl.$^6$ .................................. H01L 21/28
[52] U.S. Cl. ..................... 438/624; 438/633; 438/640; 438/740
[58] Field of Search ........................ 438/622, 624, 438/626, 633, 634, 640, 492, 489, 740

[56] References Cited

U.S. PATENT DOCUMENTS

| 4,372,034 | 2/1983 | Bohr | 438/624 |
| 4,560,034 | 12/1985 | Bukhman et al. | 438/701 |
| 4,789,648 | 12/1988 | Chow et al. | 438/634 |
| 5,246,882 | 9/1993 | Hartmann | 438/640 |
| 5,466,639 | 11/1995 | Ireland | 438/633 |
| 5,635,423 | 6/1997 | Huang et al. | 438/638 |

FOREIGN PATENT DOCUMENTS 3-268326  11/1991  Japan .......................... 438/458

Primary Examiner—T. N. Quach
Attorney, Agent, or Firm—Rabin & Champagne, P.C.

[57] ABSTRACT

A dual damascene process forms a two level metal interconnect structure by first providing a interlayer oxide over a device structure and covering the interlevel oxide layer with an etch stop layer. The etch stop layer is patterned to form openings corresponding to the pattern of the interconnects that are to be formed in the first level of the two level interconnect structure. After the etch stop layer is patterned, an intermetal oxide layer is provided over the etch stop layer. Because the etch stop layer is relatively thin, the topography formed on the surface of the intermetal oxide layer is relatively small. A photoresist mask is then provided over the intermetal oxide layer with openings in the mask exposing portions of the intermetal oxide layer in the pattern of the wiring lines to be provided in the second level of the interconnect structure. The intermetal oxide layer is etched and the etching process continues to form openings in the interlayer oxide where the interlayer oxide is exposed by the openings in the etch stop layer. Thus, in a single etching step, the openings for both the second level wiring lines and the first level interconnects are defined. Metal is then deposited over the structure and excess metal is removed by chemical mechanical polishing to define the two level interconnect structure.

12 Claims, 7 Drawing Sheets 5,801,094

1
DUAL DAMASCENE PROCESS

This application claims priority from provisional patent application Ser. No. 60/038,872, filed on Feb. 28, 1997.

BACKGROUND OF THE INVENTION

1. Field of the Invention

The present invention relates to the formation of wiring structures in integrated circuit devices. More particularly, the present invention relates to the formation of vias, interconnect metallization and wiring lines using a dual damascene process.

2. Description of the Related Art

Many highly integrated semiconductor circuits utilize multilevel wiring line structures for interconnecting regions within devices and for interconnecting one or more devices within the integrated circuits. In forming such structures, it is conventional to provide first or lower level wiring lines or interconnect structures and then to form a second level wiring line in contact with the first level wiring lines or interconnect structures. A first level interconnect might be formed in contact with a doped region within the substrate of an integrated circuit device. Alternately, a first level interconnect might be formed to a polysilicon or metal wiring line that is in contact with one or more device structures in or on the substrate of the integrated circuit device. One or more interconnections are typically formed between the first level wiring line or interconnect and other portions of the integrated circuit device or to structures external to the integrated circuit device. This is accomplished, in part, through the second level of wiring lines.

One conventional strategy for forming a two level wiring structure is illustrated in FIGS. 1–7. Referring first to FIG. 1, a two level interconnect structure is formed over a substrate 10 in which the device structures of an integrated circuit have been formed. Conventionally, the substrate 10 includes structures such as MOSFETs or bipolar transistors and doped contact regions that are to be connected to other portions of the integrated circuit or to I/O terminals provided for the integrated circuit. The surface of the substrate 10 may be the surface of a silicon device structure, including one or more doped regions, or the surface of substrate 10 may be an insulating layer. Typically, if the surface of the substrate 10 is an insulating layer, the layer will be over 1,000 Å in thickness and will include vertical interconnects filled with conductors connected to devices in the substrate. An oxide layer 12 is typically deposited over the substrate 10 by chemical vapor deposition (CVD) from a TEOS source gas to a thickness of 4,000–6,000 Å or more as an initial step in the process of forming the two level interconnect structure.

The positions of the first level interconnect structures are defined by a conventional photolithography process which forms openings 14 through the oxide layer 12 (FIG. 2) where the first level interconnects will be formed. Generally, the openings 14 expose all or portions of conductors or doped regions in the substrate to which interconnects are formed. The openings 14 are filled with a metal interconnect 16 that might, for example, consist of a thin "glue" or adhesion layer over the inner surface of the contact opening 14 and over the exposed surface of the substrate 10. Suitable adhesion layers include titanium nitride and other conductive materials incorporating refractory metals. The remainder of the opening 14 is filled with a metal such as tungsten to form the interconnect 16. The tungsten portion of the interconnect might be formed by CVD or by selective CVD, followed by an etchback or polishing process. The resulting structure is shown in FIG. 3.

Referring now to FIG. 4, a layer of metal 18 is deposited to a thickness appropriate for second level wiring lines over the surface of the oxide layer 12 and over the metal plug 16. The metal layer 18 will be patterned into the second level wiring lines and might be a single layer of aluminum or layer 18 might be a multilayer wiring structure including refractory metals or compounds including refractory metals, along with other less expensive metals. The second level wiring lines 20 are defined in a conventional photolithography process by providing a layer of photoresist over the metal layer 18, exposing the photoresist through a mask and removing portions of the exposed photoresist layer to form a photoresist etch mask. The portions of the metal layer 18 exposed by openings in the photoresist mask are then removed by etching and the photoresist mask is removed by ashing to form the structure shown in FIG. 5. After the two level interconnect structure shown in FIG. 5 is formed, it is necessary to provide an intermetal dielectric (IMD) layer between the second level wiring lines and covering the second level wiring lines to accommodate further processing of the integrated circuit device. The intermetal dielectric layer might consist of one or more layers of oxide deposited by plasma enhanced chemical vapor deposition (PECVD) or other CVD processes. The intermetal dielectric layer 22 formed in this manner generally has an uneven surface topography, as illustrated in FIG. 6. It is thus necessary to planarize the intermetal dielectric layer 22, using for example chemical mechanical polishing (CMP), to form a planarized intermetal dielectric layer 24 as shown in FIG. 7.

The method used to form the two level interconnect structure of FIG. 7 has a variety of disadvantages. For those future applications which use copper within the conductors or wiring lines, etching of the copper metal is very difficult since appropriate etching chemicals and techniques have not yet been identified. It is therefore desirable to utilize a method of forming wiring lines that does not rely on patterning a metal layer in a chemical etching process. Reduced device dimensions also introduce difficulties into the described wiring line formation method. Depositing metals into openings in dielectric layers and depositing dielectric materials into relatively narrow openings between metal lines are difficult processes that are subject to void formation and the trapping of impurities. This is particularly true as interconnects and wiring lines are made smaller and the spacing between wiring lines is made narrower. As such, the process of forming the FIG. 7 structure exhibits a fairly high rate of defect formation which is expected to increase for smaller design rules. Because the process of FIGS. 1–7 requires that spaces between wiring lines be filled by deposition processes, the process of FIGS. 1–7 is ill suited to further reductions in the design rules used in the manufacture of the device. In addition, providing the necessary planar surface on the intermetal dielectric layer after completion of the two level interconnect structure requires additional processing steps. It is desirable whenever possible to reduce the number of processing steps required to form a device because reducing the number of processing steps shortens the time required to produce the device and because eliminating processing steps improves yields and so reduces costs. Because of these factors, other methods of making multilevel interconnect structures have been investigated.

One alternative to the conventional interconnect formation process is the so called dual damascene process. Dual damascene processes are more immediately scaleable to smaller design rules and most dual damascene processes naturally produce a planarized final surface over the interconnect structure. Accordingly, a surface that is appropriate for further processing steps can be obtained using the dual damascene process in fewer process steps than in the method illustrated in FIGS. 1–7. Aspects of a dual damascene process are illustrated in FIGS. 8–14. As with the more conventional interconnect process illustrated in FIGS. 1–7, the dual damascene process begins with deposition of an oxide layer 12 over the substrate 10, as illustrated in FIG. 8. A relatively thin silicon nitride etch stop layer 30 is deposited over the oxide layer 12 (FIG. 9) for use in a subsequent etching step. As shown in FIG. 10, a layer of intermetal dielectric 32 is deposited on the etch stop layer 30. Typically, the intermetal dielectric material is chosen to be silicon oxide so that the underlying silicon nitride layer 32 is an effective etch stop when openings for second level interconnects are provided in the oxide intermetal oxide layer 32. The thickness of the intermetal oxide layer 32 is chosen to be that appropriate for the second level metal wiring lines, typically 4,000–6,000 Å or more.

A series of photolithography steps are performed to first define the pattern of the second level wiring lines and then to define the pattern of the interconnects within the first level of the interconnect structure. A mask is formed on the intermetal oxide layer 32 where the mask includes a pattern of openings that correspond to the pattern of wiring lines desired for the second level wiring lines. Openings 34 are then formed in the intermetal oxide layer 32 by etching through the openings in the photoresist mask. The etching step proceeds first through the intermetal oxide layer to leave remaining portions 36 of the intermetal oxide layer between the openings 34. This first etching steps stops on the silicon nitride layer 30, and then etching is performed aligned with the openings 34 to etch through the silicon nitride layer 30, leaving remaining portions of the silicon nitride layer 38 on either side of the openings 34. The photoresist mask is then removed by ashing, producing the structure illustrated in FIG. 11. It is generally necessary for the width of the openings 34 in the patterned intermetal oxide layer 36 to be greater than the lithography resolution limit because further photolithography steps are necessary to define the interconnects of the first level. Forming the openings 34 wider than the resolution limit provides greater process latitude for the steps used to form the first level interconnects.

Referring now to FIG. 12, a photoresist mask 40 is formed over the device of FIG. 11 by conventional photolithography. Openings 42 are provided in the mask 40 that expose selected portions of the first oxide layer 12 lying within the openings 34. Etching is performed on the first oxide layer 12 exposed within the openings 42 in the photoresist mask 40 to define the pattern of interconnects that make up the first level of the interconnect structure. The photoresist mask 40 is then removed by ashing. Next, a layer of metal 44 is deposited over the device to fill the openings in the intermetal oxide layer 36 and to fill the openings in the first oxide layer 12. As illustrated in FIG. 13, it is conventional to overfill the openings 34 in the intermetal oxide layer 36 to ensure that the openings in both the intermetal oxide 36 and the first oxide layer 12 are completely filled. The excess metal is then removed, typically in a CMP process, to provide the second level metal wiring lines 46 and first level interconnects 48 of the two level interconnect structure shown in FIG. 14. As is illustrated in FIG. 14, the result of the final CMP step provides a planarized surface which is well suited to further processing steps.

The dual damascene process illustrated in FIGS. 8–14 provides several advantages over the conventional process illustrated in FIGS. 1–7. The process illustrated in FIGS. 8–14, however, is very demanding from a process technology point of view. It is therefore desirable to develop a dual damascene process that has wider process latitude and is more readily adapted to a high volume manufacturing process.

SUMMARY OF THE PREFERRED EMBODIMENTS

In accordance with one aspect of the present invention, an integrated circuit including first level and second level conductor structures are formed on a substrate incorporating one or more integrated circuit devices. First an interlayer dielectric layer and then an etch stop layer are provided over the substrate. The etch stop layer is patterned to define openings in the patterned etch stop layer corresponding to positions where first level conductor structures are to be formed.

An intermetal dielectric layer is then provided over the patterned etch stop layer. A second level mask is formed over the intermetal dielectric layer having openings corresponding to positions where second level conductor structures are to be formed. The method continues by etching through the openings in the second level mask to form second level conductor openings in the intermetal dielectric layer and etching through the openings in the patterned etch stop layer to form first level conductor structures in the interlayer dielectric layer. Metal is deposited into the second level conductor openings and into the first level conductor structures.

DETAILED DESCRIPTION OF THE PREFERRED EMBODIMENTS

Figure 1:
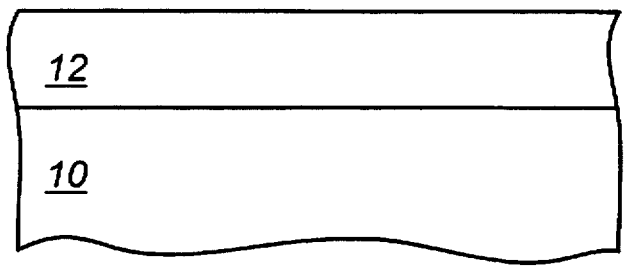
FIGS. 1–7 illustrate a conventional process for forming a two level interconnect structure.
Figure 2:
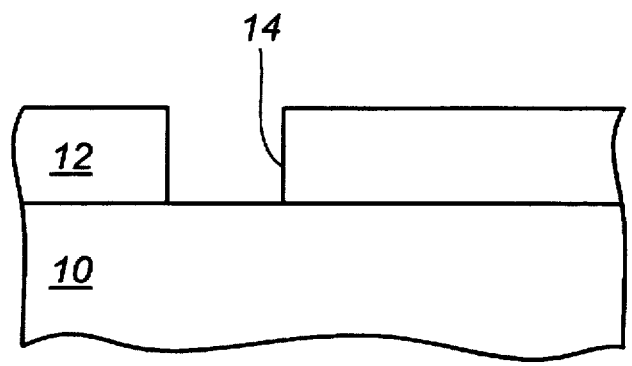
Figure 3:
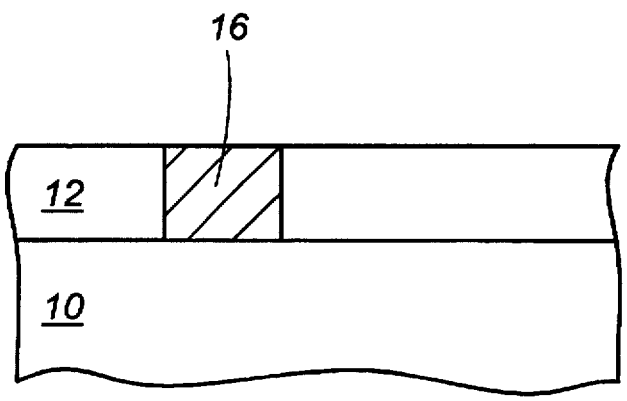
Figure 4:
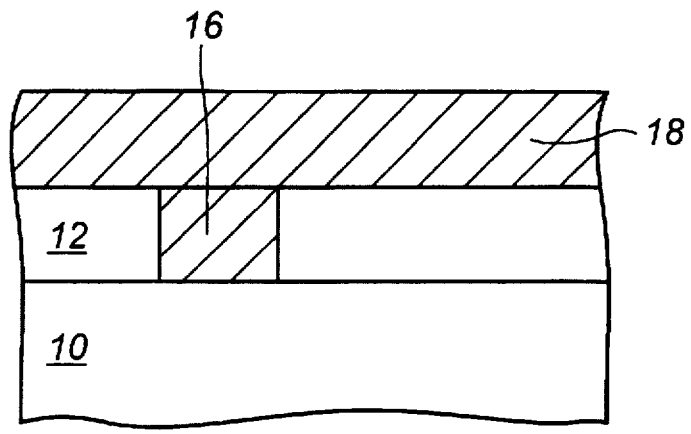
Figure 5:
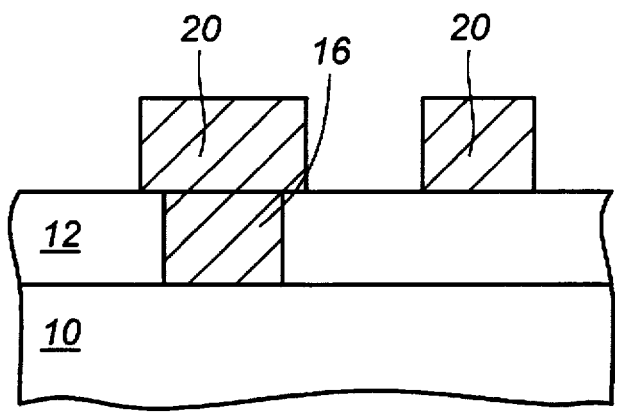
Figure 6:
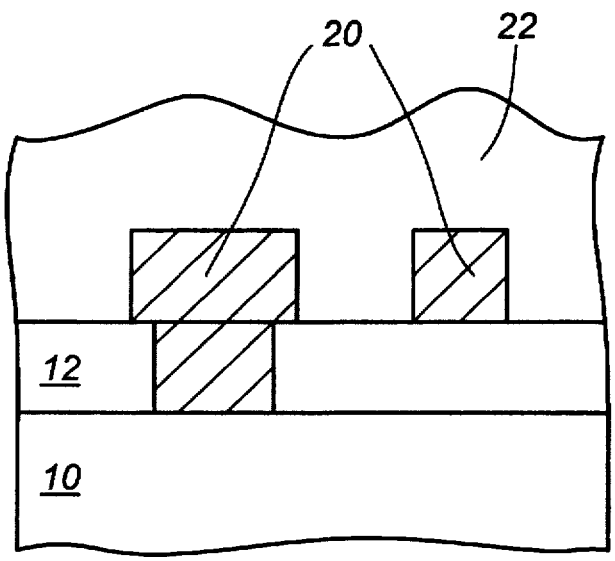
Figure 7:
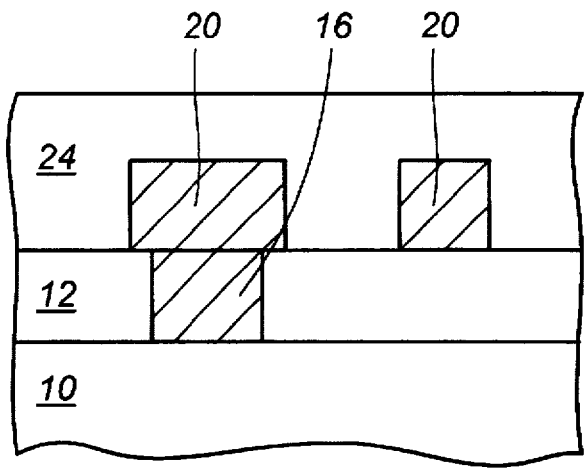
Figure 8:
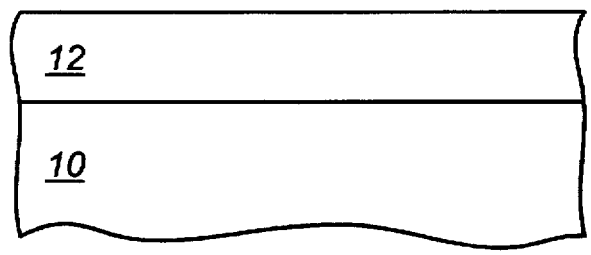
FIGS. 8–14 illustrate aspects of a dual damascene process for forming a two level interconnect structure.
Figure 9:
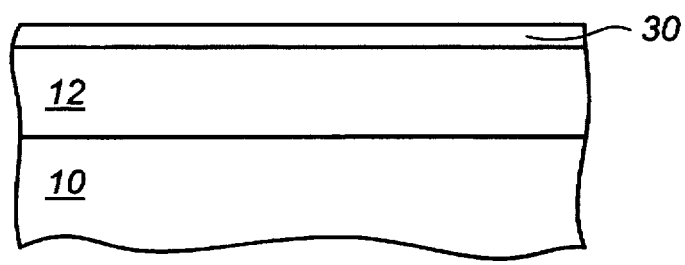
Figure 10:
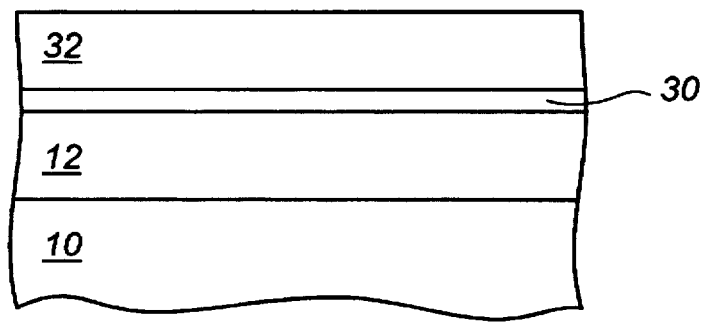
Figure 11:
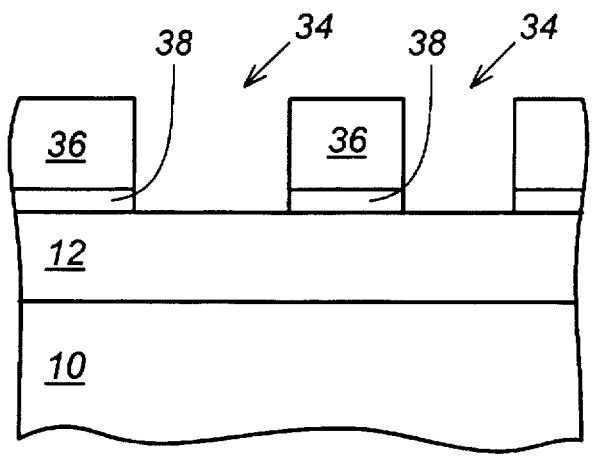
Figure 12:
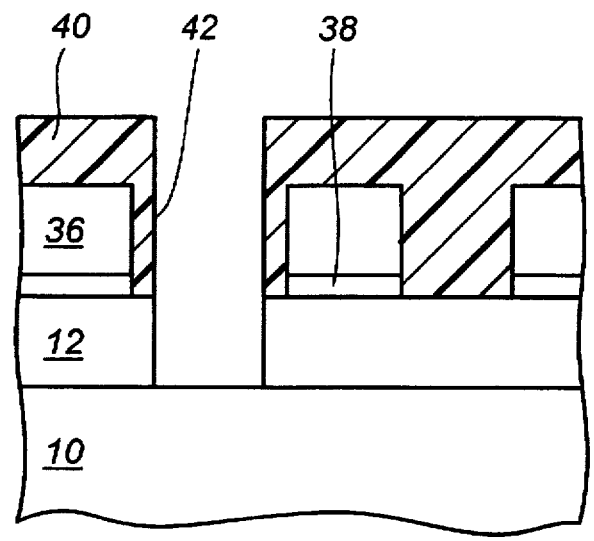
Figure 13:
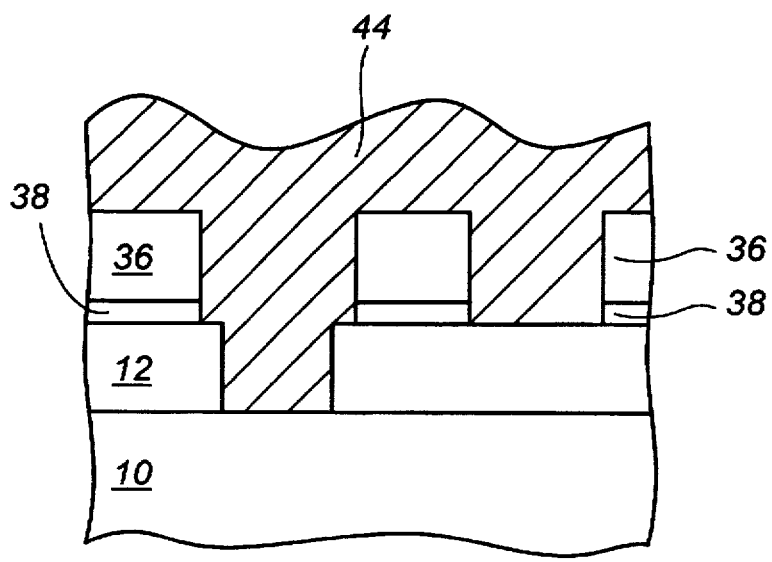
Figure 14:
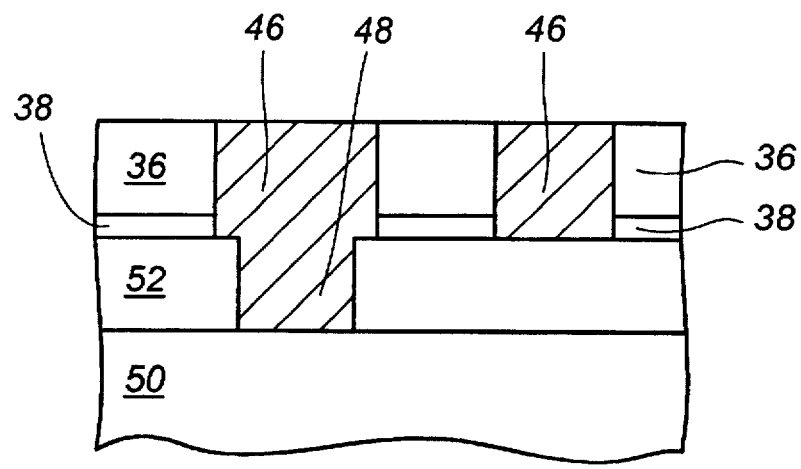

The dual damascene process illustrated in FIGS. 8–14 requires formation of a thick photoresist layer 40 over the uneven topography of the FIG. 11 structure. Accordingly, it is necessary to have a long depth of focus to expose the entire thickness of the photoresist mask 40 to provide well defined openings 42 in the photoresist mask. High resolution steppers of the type preferred in modern manufacturing processes have great difficulty in providing the depth of focus required for the formation of the photoresist mask illustrated in FIG. 12. This process step is even more difficult when performed over the uneven surface topography typically present above an integrated circuit device. Preferred embodiments of the present invention avoid the necessity of such a thick photoresist mask, and the associated requirement for a long depth of focus photolithography process, by patterning the etch stop layer of the conventional dual damascene process prior to depositing the intermetal oxide layer. Thus, preferred embodiments of the present invention form photoresist masks over far more planar structures than those illustrated in FIG. 11 of the conventional dual damascene process. Photoresist masks having a more uniform thickness can then be provided and the mask exposure step can be performed with a smaller depth of focus, as is preferred to accommodate the highest resolution steppers.

In a particularly preferred embodiment of the present invention, a two level interconnect structure is formed by providing a first oxide layer over the substrate and covering the first oxide layer with an etch stop layer. The etch stop layer is patterned to form openings corresponding to the pattern of interconnects that are later to be formed in the first level of the two level interconnect structure. After the etch stop layer is patterned, an intermetal oxide layer is provided over the etch stop layer, within which the second level wiring lines are to be formed. Because the etch stop layer is relatively thin, the topography formed on the surface of the intermetal oxide layer by the interconnect patterning within the etch stop layer is relatively small. A mask is then provided over the intermetal oxide layer with openings in the mask exposing portions of the intermetal oxide layer in the pattern of the wiring lines to be provided in the second level of the interconnect structure. The intermetal oxide layer is etched and the etching process continues into the first oxide layer where the first oxide layer is exposed through the openings in the etch stop layer to form openings in the first oxide layer corresponding to the openings in the etch stop layer. In effect, the etch stop layer acts as a hard mask for the process of etching the interconnect pattern into the first oxide layer. Thus, in a single etching step, the openings for both the second level wiring lines and the first level interconnects are defined. Metal is then deposited over the structure and excess metal is removed by, for example, polishing to define the final two level interconnect structure.

Figure 15:
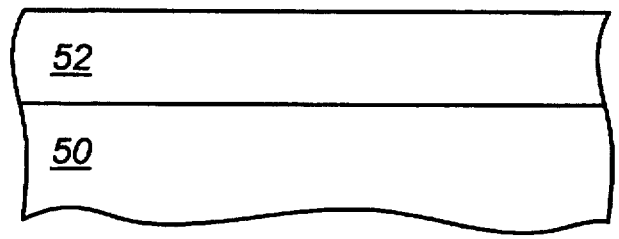
FIGS. 15–21 illustrate aspects of a dual damascene process in accordance with preferred embodiments of the present invention.

Preferred embodiments of the present invention are now described with more particular reference to FIGS. 15–21. While the following description is made in terms of first level interconnects and second level wiring lines, it is to be understood that aspects of the present invention find application to the formation of contacts between two layers of wiring lines and between nonadjacent layers of conductors. Accordingly, it is possible to use aspects of the present invention in forming interconnects between a first level and a third or other level of a wiring structure. The interconnect formation method of the present invention is preferably begun after formation of an integrated circuit device within substrate 50. The interconnect formation method begins by depositing an interlayer dielectric layer 52 over the surface of the substrate 50 (FIG. 15). The interlayer dielectric layer 52 may be an oxide layer deposited to a thickness of several thousand angstroms or more by a PECVD process, a low pressure chemical vapor deposition (LPCVD) process, or another dielectric deposition process. Any of these processes might use, for example, a TEOS source gas. Often, the surface of the substrate 50 will have an uneven topography corresponding to the device structures within the integrated circuit device. It is accordingly preferred that the surface of the interlayer dielectric layer 52 be planarized before the two level interconnect structure is formed. Planarization may be accomplished in an etch back process, but is more preferably accomplished using CMP. The end thickness of the interlayer dielectric layer 52 is dictated by the topography of the underlying integrated circuit device and will thus vary from design to design. The height of the first level interconnect formed through layer 52 will be dictated by whatever thickness is provided for the interlayer dielectric 52.

Figure 16:
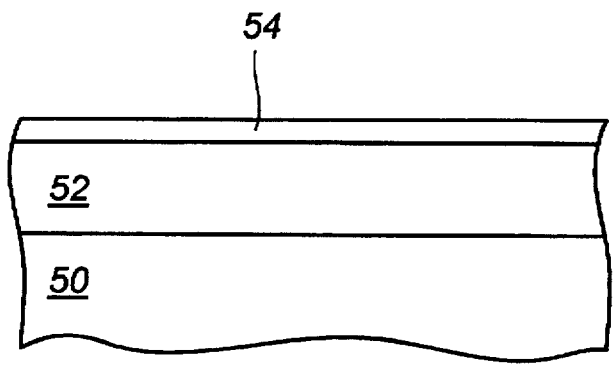
Figure 17:
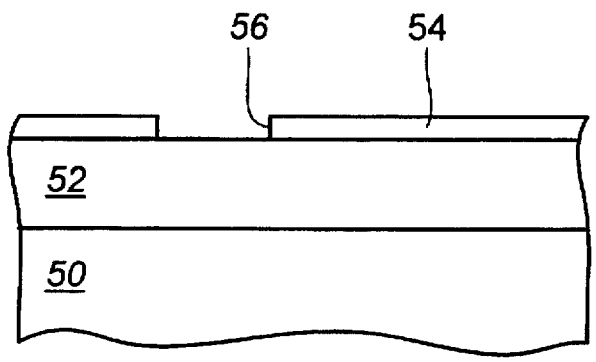

An etch stop layer 54 is deposited over the planarized surface of the interlayer dielectric layer 52 (FIG. 16). It is preferred that the material chosen for the etch stop layer be different from both the interlayer dielectric layer beneath the etch stop layer and the intermetal dielectric layer formed over the etch stop layer. Typically, the interlayer dielectric layer 50 and the intermetal dielectric layer are both preferred to be oxides, so an appropriate choice for the etch stop layer 54 is silicon nitride. Besides being sufficiently different from silicon oxide to serve as an etch stop layer, silicon nitride has the further advantage of being an insulator which is desirable since the etch stop layer will generally be left in place in the finished interconnect structure and will extend between different wiring lines. The etch stop layer 54 is preferably made thin to minimize the impact of the etch stop layer on the surface topography of the device in later processing steps. On the other hand, the etch stop layer 54 should be sufficiently thick to function as an etch stop layer throughout the etching of both the intermetal dielectric and the interlayer dielectric layers. In addition, the etch stop layer should be sufficiently thick to act as a hard mask in the etching of interconnect openings in the interlayer dielectric layer 50. An appropriate silicon nitride etch stop layer 54 might have a thickness of between about 200–1,500 Å.

The etch stop layer 54 is then patterned to provide openings in the etch stop layer 54 corresponding to the positions where first level interconnects are to be formed within the interlayer dielectric layer 50. Accordingly, a mask is formed over the silicon nitride layer 54 which provides appropriate openings which expose portions of the silicon nitride layer 54 where interconnects are to be formed, and then the silicon nitride etch stop layer 54 is etched to provide openings 56 which expose portions of the interlayer dielectric layer 52. To minimize the impact of the openings 56 through the etch stop layer 54 on the surface topography of the not yet formed intermetal dielectric layer, it is preferred that the etching process which forms the openings 56 through the silicon nitride etch stop layer 54 stop on the underlying surface of the interlayer oxide layer 52. Preferably, no depression is formed at the surface of the interlayer oxide layer 52 in the process of forming the openings 56. This and other etching steps performed on the dielectric and etch stop layers of the present invention can be advantageously performed in an etching system such as the Lam Research Rainbow system. The Lam Research Rainbow system uses etchants derived from one or more source gases such as $SF_6$ or $C_2F_6$ mixed with different quantities of other gases such as HBr and He to adjust the selectivity of the etching process. In such a system, the selectivity of the etch process between silicon oxide and silicon nitride can be automatically adjusted over a wide range of selectivities. Thus, in the etching process used to etch the silicon nitride etch stop layer 54, the selectivity is adjusted to etch silicon nitride while not etching silicon oxide, preferably to the greatest extent possible. Variations are possible, though presently undesired, because etching of the interlayer silicon oxide layer 52 at this time will require a higher depth of focus in subsequent lithography processes. The mask used for patterning the silicon nitride etch stop layer 54 is then removed, forming the structure illustrated in FIG. 17.

Figure 18:
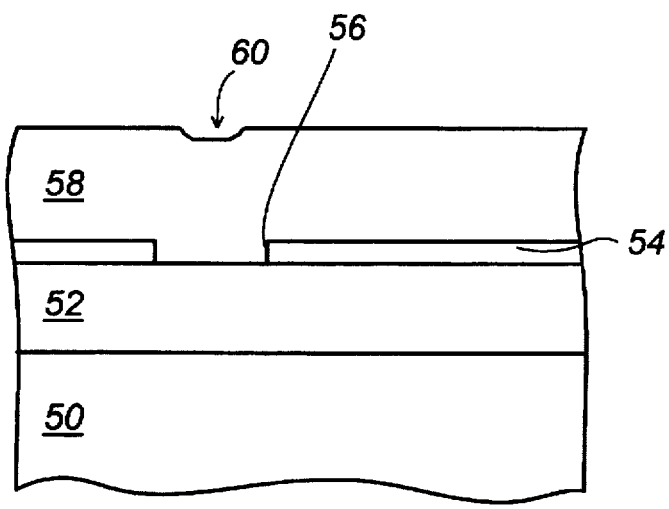

An intermetal dielectric layer 58 is then deposited over the patterned etch stop layer 54 (FIG. 18). As discussed above, it is preferred that the intermetal dielectric layer 58 be formed of the same material as the interlayer dielectric 52 and of a material different from the etch stop layer 54. As such, the intermetal dielectric layer 58 is preferably a layer of silicon oxide. The intermetal oxide layer 58 might be deposited through a CVD process from a TEOS precursor or $SiH_4$ source gas to a thickness appropriate for second level wiring lines, since the thickness of the second level wiring lines will be determined by the thickness of the intermetal oxide layer. For present device structures, second level wiring lines might be on the order of 4,000–8,000 Å in thickness and so the intermetal oxide layer 58 is deposited to a thickness on the order of 4,000–8,000 Å. Relatively small depressions 60 will be formed on the surface of the intermetal oxide layer 58 corresponding to the presence of the openings 56 in the etch stop layer 54. Because the depth of the depressions 60 will be much smaller than the topography present in the conventional dual damascene process, such as that illustrated in FIG. 11, the depressions 60 will present a comparatively small problem for maintaining focus through a photoresist layer provided over the intermetal dielectric layer 58 in the photolithography step used to define the pattern for the second level wiring lines.

Figure 19:
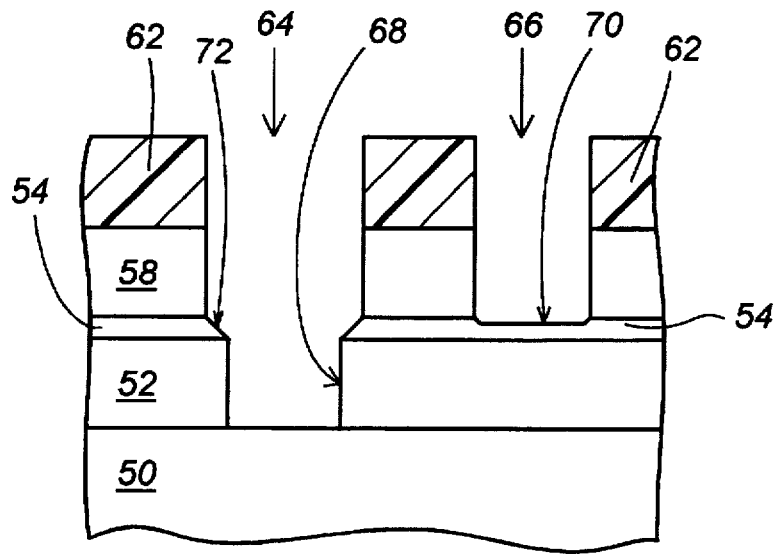

Referring now to FIG. 19, a photoresist mask 62 is formed on the intermetal oxide layer 58. The mask 62 has a pattern of openings corresponding to the pattern of second level wiring lines that are to be formed in the intermetal oxide layer 58. Some of the openings 64 in the photoresist mask 62 are disposed over the openings 56 in the etch stop layer 54 where first level interconnects are to be formed beneath portions of the second level wiring lines. Others of the openings 66 in the photoresist mask 62 are formed over positions where second level wiring lines are to be formed but no first level interconnects are to be formed. It may be desirable to form slightly wider openings 64 in the photoresist mask 62 over the openings 56 in the etch stop layer 54. Such wider openings 64 in the photoresist mask 62 will form wider openings in the intermetal oxide layer 58, which can have several benefits in the manufacturing process. First, alignment of the second level wiring lines with respect to the openings 56 in the etch stop layer, and thus the first level interconnects, will be made easier. In addition, the resultant wider openings in the intermetal oxide layer 58 will reduce the aspect ratio of the holes to be filled in the metal deposition process, thereby making it easier to fill the holes in the process of forming the first level interconnects.

The intermetal oxide layer 58 is then etched through the openings 64, 66 in the photoresist mask 62 using a process that is highly selective to oxide, that is, the etching process should readily etch oxide but not etch the material of the etch stop layer 54, (silicon nitride), to the extent possible. An appropriately selective etching process may, for example, be accomplished using an etchant derived from a mixture of source gases including $C_4F_8$/CO or $CF_4$ mixed with $CHF_3$, Ar or $N_2$. Thus, the etching process removes portions of the intermetal oxide layer 58 everywhere that it is exposed by the photoresist mask to define openings within the intermetal dielectric layer 58 in which the second level wiring lines are to be formed. The etching process stops on the silicon nitride etch stop layer 54 within those portions of the photoresist mask openings 66 that lie over a solid etch stop layer 54. Within those photoresist mask openings 64 that lie over openings 56 in the silicon nitride etch stop layer 54, the etching process continues into the interlayer dielectric oxide layer 52 to form openings 68 aligned with the etch stop mask openings 56, with the etch stop layer 54 acting partially as a hard mask for this process. The openings in the interlayer dielectric oxide layer 52 will later be filled with metal to provide the first level interconnects for the device.

The etching process used in forming the second level wiring lines and the first level interconnects is highly selective to oxide while substantially not etching the silicon nitride etch stop layer 54. Despite the high level of selectivity, the etching process used to form the openings in the interlayer oxide layer 52 still etches exposed surfaces of the silicon nitride etch stop layer 54 to a small extent. Thus, the surface of the etch stop layer 54 exposed may be etched to form slight depressions 70 within the openings 66 in the photoresist mask that are not over openings 56 in the etch stop layer. The edges of the openings 56 in the etch stop layer 54 are also etched slightly in this process, providing a tapered edge 72 to the openings in the etch stop layer. Formation of such a tapered edge 72 to the openings in the etch stop layer 54 is preferred, because such a tapered edge enhances the ability to fill the openings 68 within the interlayer dielectric layer 52. The presence of a tapered edge 72 reduces the propensity to form an overhang over the opening 68 in the interlayer dielectric layer 52. As such, if the process used to etch the intermetal oxide layer 58 and the interlayer oxide layer 52 do not form a taper 72 along the edge of the openings 56 in the etch stop layer 54, it may be desirable to include an isotropic etching process on the edges of the openings in the etch stop layer 54 after the intermetal dielectric layer 52 is etched to form a tapered sidewall on the openings in the etch stop layer.

Figure 20:
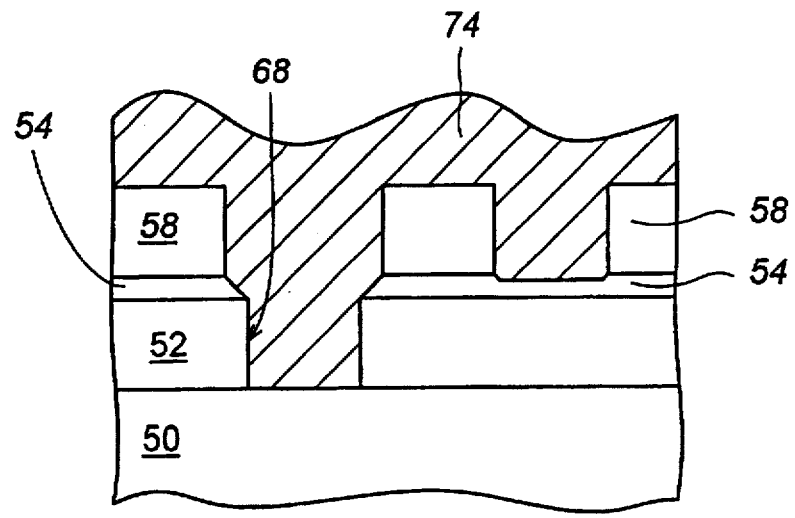
Figure 21:
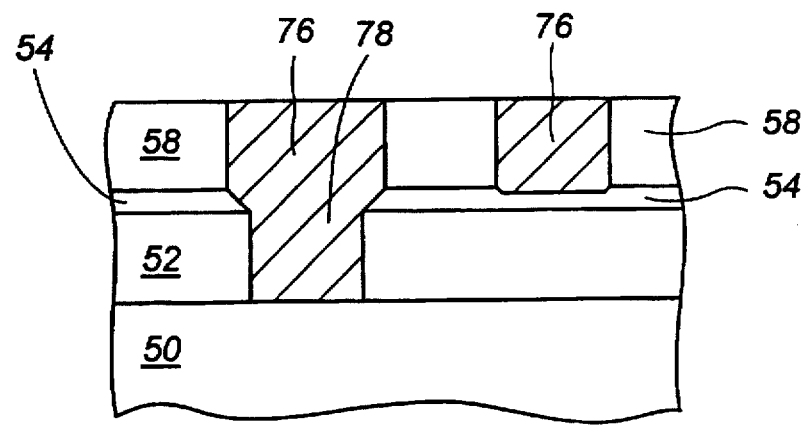

After the FIG. 19 structure is complete, the photoresist mask 62 is stripped by ashing and the structure is ready for the deposition of a metal layer 74 to fill the openings in the intermetal dielectric layer 58 and the interlayer dielectric layer 52, as illustrated in FIG. 20. The metal layer 74 may be a single metal, such as aluminum deposited by sputtering, or another low cost metal. The demands placed by high density integrated circuit devices on wiring structures are complex, however, and it is more typical to use a multilayer wiring structure to fill the openings in the structure of FIG. 19. For example, it may be desirable to provide a thin "glue" or adhesion layer on the inner surfaces of the openings exposed within the openings 64, 66. This glue layer may enhance the subsequent deposition of certain types of plug metals. Alternately, the glue layer may act primarily as a barrier to interdiffusion between the metal of the interconnect structures and the substrate. Appropriate glue layers include titanium, tungsten, a solid solution of titanium and tungsten, or alternate compounds, many of which also include refractory metals, such as titanium nitride. These glue layer metals may be deposited by CVD or by a physical vapor deposition process, depending on the nature of the particular material being used as a glue layer. After the thin glue or adhesion layer is formed on the inner surfaces of the openings in the dielectric layers, the remaining portions of the openings are filled, typically with a plug metal different from the metal used as the glue layer. The plug metal may be, for example, tungsten, aluminum, alloys including aluminum, copper, alloys including copper, and a variety of other metals, depending on the particular device being formed and the constraints of the process used for forming the device. As is known in the art, these metals can generally be deposited by physical vapor deposition processes such as sputtering, but certain metals are more preferably deposited by CVD. The metal layer 74 provided over the structure is preferably overfilled, as shown in FIG. 20.

Definition of the two level interconnect structure is completed by removing excess portions of the metal layer 74, preferably in a metal CMP process. The end result of such a polishing process is to provide a planar surface extending across the second level wiring lines 76 and the intermetal dielectric layer 58. In this way, both first level interconnect structures 78 and second level wiring lines 76 are provided using a single oxide etch step and without having to deposit dielectric material between metal lines. In addition, the more planar surfaces on which the photoresist masks are formed in the process of FIGS. 15–21 for forming the two level interconnect structure allow for photolithography to be performed with greater accuracy. Finally, the process of the present invention naturally provides a planarized surface, as shown FIG. 21, that accommodates further processing steps.

Processes in accordance with the methods of the present invention can thus form two level interconnect structures with greater reliability and ease of manufacture. Subsequent processing normally includes depositing a further level of a wiring line on the surface of the structure illustrated in FIG. 21. Typically, a layer of a glue metal is deposited over the surface of the device and additional metal is blanket deposited and then the metal layer is patterned to define third level wiring lines.

While the present invention has been described with particular reference to preferred embodiments thereof, it is to be understood that these embodiments are provided by way of example. Those of ordinary skill will readily appreciate that variations and modification can be made from these embodiments without varying from the basic teachings of the present invention. Accordingly, the scope of the present invention is not to be limited to the described preferred embodiments, but instead the scope of the present invention is to be determined by the claims, which follow.

What is claimed:

1. A method of making an integrated circuit having first level conductor structures and second level conductor structures, the method comprising:

providing a substrate incorporating one or more integrated circuit devices;

providing an interlayer dielectric layer over the substrate;

providing an etch stop layer over the interlayer dielectric layer;

patterning the etch stop layer to define openings in the patterned etch stop layer corresponding to positions where first level conductor structures are to be formed;

providing an intermetal dielectric layer over the patterned etch stop layer;

forming a second level mask over the intermetal dielectric layer, the second level mask having openings corresponding to positions where second level conductor structures are to be formed;

etching through the openings in the second level mask to form second level conductor openings in the intermetal dielectric layer, and etching through the openings in the patterned etch stop layer to form first level conductor openings in the interlayer dielectric layer and to provide edges of the openings, in the patterned etch stop layer, with a tapered configuration, so that the openings in the patterned etch stop layer provide for a step-free transition between respective ones of the second level conductor openings in the intermetal dielectric layer and the first level conductor openings in the interlayer dielectric layer; and depositing metal into the second level conductor openings and into the first level conductor openings.

2. The method of claim 1, further comprising removing metal from above the intermetal dielectric layer, leaving metal within the second level conductor openings and the first level conductor openings.

3. The method of claim 2, wherein the removing metal leaves metal plugs in the second level conductor openings having upper surfaces coplanar with surrounding portions of the intermetal dielectric layer.

4. The method of claim 3, wherein the removing metal leaves a planarized surface over the metal plugs and the intermetal dielectric layer.

5. The method of claim 4, wherein the removing metal includes chemical mechanical polishing or etching.

6. The method of claim 4, wherein the removing metal is accomplished by chemical mechanical polishing.

7. The method of claim 1, wherein the interlayer dielectric and the intermetal dielectric comprise silicon oxide.

8. The method of claim 7, wherein the etch stop layer comprises silicon nitride.

9. The method of claim 1, wherein the openings in the second level mask are larger across than the openings in the patterned etch stop layer.

10. The method of claim 1, wherein the patterned etch stop layer acts as a hard mask for etching the interlayer dielectric.

11. The method of claim 1, wherein the openings in the patterned etch stop layer are tapered so that an upper portion of the openings in the patterned etch stop layer is wider across than a lower portion of the openings in the patterned etch stop layer.

12. The method of claim 1, wherein the interlayer dielectric and the intermetal dielectric comprise silicon oxide, the etch stop layer comprises silicon nitride and the etch stop layer is in contact with both the interlayer dielectric layer and the intermetal dielectric layer.

* * * * *